United States Patent [19]
Ichiyoshi

[11] Patent Number: 5,699,383
[45] Date of Patent: Dec. 16, 1997

[54] HIGH-POWER LINEAR AMPLIFICATION USING PERIODICALLY UPDATED AMPLITUDE AND PHASE CORRECTION VALUES

[75] Inventor: Osamu Ichiyoshi, Tokyo, Japan

[73] Assignee: NEC Corporation, Tokyo, Japan

[21] Appl. No.: 611,557

[22] Filed: Mar. 6, 1996

[30] Foreign Application Priority Data

Mar. 6, 1995 [JP] Japan .................................. 7-045615

[51] Int. Cl.$^6$ .................................. H04B 3/08; H03F 1/32
[52] U.S. Cl. ..................... 375/297; 375/296; 375/284; 375/308; 455/126; 455/127; 330/149; 332/103; 332/160; 332/162; 332/176
[58] Field of Search .................................. 375/261, 281, 375/284, 285, 296–298, 308; 455/78, 83, 126–127; 330/149; 332/103, 159, 160, 162, 176

[56] References Cited

U.S. PATENT DOCUMENTS

| | | | |
|---|---|---|---|
| 4,291,277 | 9/1981 | Davis et al. | 330/149 |
| 4,462,001 | 7/1984 | Girard | 330/149 |
| 4,700,151 | 10/1987 | Nagata | 332/123 |
| 4,908,840 | 3/1990 | Kakimoto | 375/296 |
| 5,093,637 | 3/1992 | Isota et al. | 332/103 |
| 5,107,520 | 4/1992 | Karam et al. | 375/296 |
| 5,148,448 | 9/1992 | Karam et al. | 375/298 |
| 5,396,190 | 3/1995 | Murata | 330/149 |
| 5,404,378 | 4/1995 | Kimura | 375/296 |
| 5,486,789 | 1/1996 | Palandech et al. | 330/149 |
| 5,524,285 | 6/1996 | Wray | 455/126 |

FOREIGN PATENT DOCUMENTS

| | | | |
|---|---|---|---|
| 0 316 941 | 5/1989 | European Pat. Off. | 375/308 |
| 0 380 167 | 8/1990 | European Pat. Off. | |
| 0 387 948 | 9/1990 | European Pat. Off. | |
| 0 632 624 | 1/1995 | European Pat. Off. | |
| 0 658 975 | 6/1995 | European Pat. Off. | |
| 62-78902 | 4/1987 | Japan. | |

OTHER PUBLICATIONS

Lohtia et al, "Power Amplifier Linearization using Cubic Spline Interpolation", Personal Communication, Freedom Through Wireless Technology, Secaucus, NJ, IEEE, 1993, pp. 676–679.

Patent Abstracts of Japan, vol. 17 No. 317, Jun. 1993.

Feng et al, "A Modified Adaptive Compensation Scheme for Nonlinear Bandlimited Satellite Channels", Countdown to the New Millenium, Phoenix, IEEE, 1991, pp. 1551–1555.

Leyonhjelm et al., "Digital Signal Processing and Direct Conversion for Multichannel Transmitters", IEEE (O–7803–1927–3/94), pp. 494–498, (1994).

*Primary Examiner*—Young T. Tse
*Attorney, Agent, or Firm*—Foley & Lardner

[57] ABSTRACT

In a high-power transmitter, an input complex signal is multiplied in a complex multiplier by control signals. The output complex signal from the multiplier is converted to a high frequency signal and amplified by a power amplifier for transmission. The amplitude of the input complex signal is detected to access a memory where amplitude and phase correction values are stored. During a read mode of the memory, a set of amplitude and phase correction values is specified by the detected amplitude and supplied to the complex amplifier as the control signals. During a write mode of the memory, a set of amplitude and phase correction values is specified by a delayed version of the detected amplitude and rewritten with a set of new amplitude and phase correction values. The amplified high frequency signal is down-converted to a low frequency complex signal. The nonlinearity of the power amplifier is determined from a delayed version of the input complex signal and the down-converted complex signal and the new amplitude and phase correction values are produced from the detected nonlinearity and delayed versions of the amplitude and phase correction values which were supplied to the complex multiplier. At intervals, the memory is switched from the read mode to the write mode for updating its contents.

9 Claims, 2 Drawing Sheets

HIGH-POWER LINEAR AMPLIFICATION USING PERIODICALLY UPDATED AMPLITUDE AND PHASE CORRECTION VALUES

BACKGROUND OF THE INVENTION

1. Field of the Invention

The present invention relates to linearization of power amplifier. The present invention is particularly suitable for high-power linear amplification of wideband signals.

2. Description of the Related Art

The power amplifier stage of a transmission station is usually operated in a saturated region of its operating characteristic for high power transmission of signals over long distances. Due to the nonlinear characteristic of the saturated region, intermodulation products occur, causing the original wave to spread over a range of frequencies which might cause adjacent channel interference. To compensate for the nonlinearity of a high power amplifier, Japanese Provisional Patent Publication Sho-62-78902 discloses a linearization circuit where the high-frequency input of a high-power amplifier is controlled both in amplitude and phase through a negative feedback loop in accordance with a voltage and a phase difference between the amplifier's input and output signals so that both differences are reduced to zero. However, due to the inherent delay time of the feedback path, the prior art linearization technique is not suitable for high speed operation. To alleviate this problem, one prior art scheme called "predistortion" employs a circuit having a nonlinear characteristic that is inverse to that of the high-power amplifier. This type of approach also suffers from undesirable variations in circuit parameters due to varying temperature and aging.

The gain and phase imbalance of mixers and summer cause an undesired sideband signal that requires compensation if the system is to meet adjacent channel interference (ACI) specifications. A compensation method for these imbalances is discussed in a paper "Digital Signal Processing and Direct Conversion for Multichannel Transmitters", Scott A. Leyonhjelm et al, 1994 IEEE (0-7803-1927-3/94), pp 494–498. According to this method, baseband channels are combined through a transmultiplexer to form a wideband signal. The system band is directly up-converted via an analog quadrature modulator. A vacant channel position is then selected and an undesired sideband (error) signal is isolated. This error signal is used by an adaptation algorithm (which is based on a form of predistortion) to suitably modify the scaling coefficient of an input channel. The process is repeated for every channel in the system. The error signal is proportional to the magnitude of the sideband signal. The real and imaginary parts of the pre-distort coefficient are adjusted accordingly using a simple one dimensional search technique.

SUMMARY OF THE INVENTION

It is therefore an object of the present invention to provide linearization of high power wideband (high speed) signals and compensation of variations caused by a variety of time-varying factors.

According to the present invention, there is provided a transmission apparatus comprising a complex multiplier for multiplying an input complex signal by control signals and producing a compensated complex signal, an up-converter for converting the compensated complex signal to a high frequency signal, and a power amplifier for amplifying the high frequency signal for transmission. The amplitude of the input complex signal is detected by an envelope detector. A memory is provided for storing amplitude and phase correction values. During a read mode, a set of amplitude and phase correction values is specified by the detected amplitude and supplied to the complex amplifier as the control signals. During a write mode, a set of amplitude and phase correction values is specified by a delayed version of the detected amplitude and rewritten with a set of new amplitude and phase correction values. The amplified high frequency signal is down-converted to a low frequency complex signal. The nonlinearity of the power amplifier is determined from a delayed version of the input complex signal and the low frequency complex signal and the new amplitude and phase correction values are produced from the detected nonlinearity and delayed versions of the amplitude and phase correction values which were supplied to the complex multiplier. At intervals, the memory is switched from the read mode to the write mode for updating its contents corresponding to the delayed version of the detected amplitude.

Preferably, the nonlinearity detector means comprises an error detector for detecting amplitude and phase errors between a delayed version of the input complex signal and the low frequency complex signal and update means for producing the new amplitude and phase correction values from the amplitude and phase errors and the delayed versions of the amplitude and phase correction values. More specifically, the amplitude and phase errors are represented by a ratio between the delayed version of the input complex signal and the low frequency complex signal, and the new amplitude and phase correction values are derived through an integral feedback control path connected to the output of the memory by multiplying the delayed version of the amplitude correction value by the amplitude error and subtracting the phase error from the delayed version of the phase correction value.

BRIEF DESCRIPTION OF THE DRAWINGS

The present invention will be described in further detail with reference to the accompanying drawings, in which.

DETAILED DESCRIPTION

Figure 1:
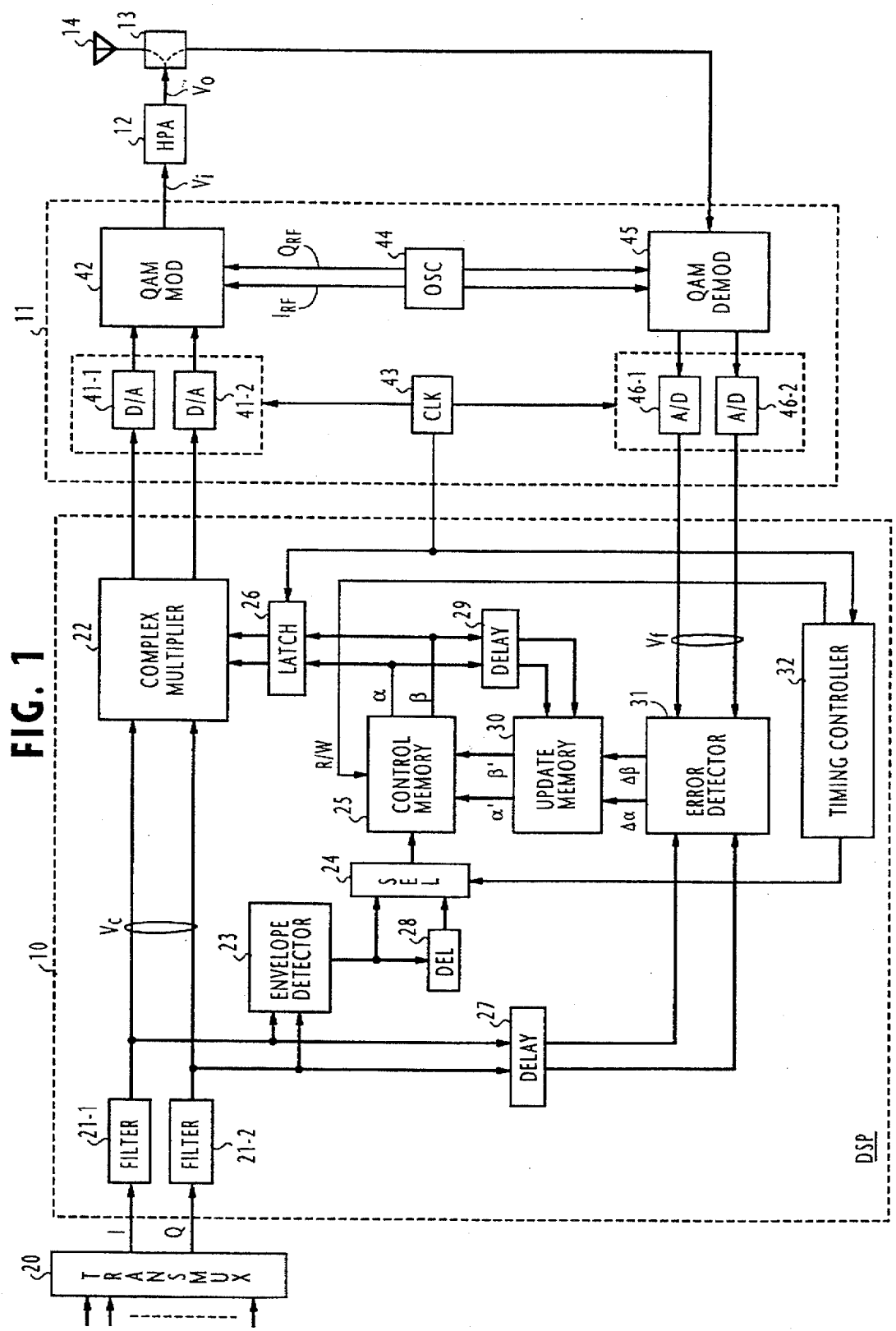
FIG. 1 is a block diagram of a wideband transmission apparatus according to the present invention.

Referring now to FIG. 1, there is shown a radio transmitter incorporating the high-power linear amplifier of the present invention. The inventive transmitter generally comprises a DSP (digital signal processor) section 10 and a frequency conversion section 11. The DSP section 10 receives the in-phase (I) and quadrature (Q) components of a wideband FDM (frequency division multiplex) signal from a transmultiplexer 20 where a plurality of input analog signals are frequency-division multiplexed and converted to digital complex signals. The DSP section 10 includes digital waveform-shaping filters 21-1, 21-2 where the I and Q component signals are respectively waveshaped. The outputs of digital filters 21-1, 21-2 are coupled to a complex multiplier 22 where they are multiplied by amplitude and phase control signals $\alpha$ and $\beta$ supplied from a control memory 25 to compensate for the nonlinearity of a high-power amplifier 12 connected to the output of frequency conversion section 11.

In order to read the control signals from control memory 25, the outputs of filters 21-1, 21-2 are supplied to an envelope detector 23 and a delay unit 27. The envelope detector 23 determines the absolute value of each component of the complex signal, combines the absolute values to produce a sum and finds its square root, giving an amplitude of the complex signal. This signal is applied direct to one input of a selector 24 and via a delay unit 28 to the other input. The output of selector 24 is used by the control memory 25 as an address to read a set of amplitude and phase correction values α and β. The control data from control memory 25 is supplied via a latch 26 to the complex multiplier 22 and via a delay unit 29 to an update memory 30. Latch 26 is driven at the data rate of the incoming signal by clock pulses supplied from a clock generator 43.

The outputs of complex multipliers 22 are converted to analog signals by digital-to-analog converters 41-1, 41-2 of the frequency conversion section 11 which are driven by the clock generator 43 and fed to a QAM (quadrature amplitude modulation) modulator 42 where the analog I and Q signals are amplitude-modulated onto radio-frequency quadrature carriers $I_{RF}$ and $Q_{RF}$ from an oscillator 44, the modulated carriers being combined together to produce an up-converted QAM signal. The output of QAM modulator 42 is amplified by the high-power amplifier 12 and transmitted via one of the output terminals of a directional coupler 13 to an antenna system 14. The other output terminal of the directional coupler 13 is connected to a QAM demodulator 45 where it is demodulated using the quadrature carriers from oscillator 44, recovering I and Q down-converted analog signals. These down-converted analog signals are transformed to digital signals by A/D converters 46-1, 46-2 and applied to an error detector 31 to which the outputs of delay unit 27 are also applied. An amplitude error Δα and a phase error Δβ are detected between the outputs of delay unit 27 and those of A/D converters 46-1, 46-2 in the error detector 31 and supplied to the update memory 30.

Delay units 27, 28 and 29 are shift registers that provide a delay to their input signal corresponding to the time taken for the complex signal to reappear at the outputs of A/D converters 46-1, 46-2. A timing controller 32 is driven by clock generator 43 to supply a switching control signal to the selector 24 and a read/write control signal to control memory 25 at a predetermined frequency (typically in the range between 100 kHz and 10 MHz) so that, at periodic intervals, the control memory 25 is switched to write mode and the output of delay unit 28 is selected to specify a set of amplitude and phase correction values stored in control memory 25 and rewrite the specified correction values with the outputs of update memory 30.

When the control memory 25 is in a read mode, the output of envelope detector 23 is selected by selector 24 and is used by control memory 25 to read a set of amplitude and phase correction values into the latch 26.

Figure 2:
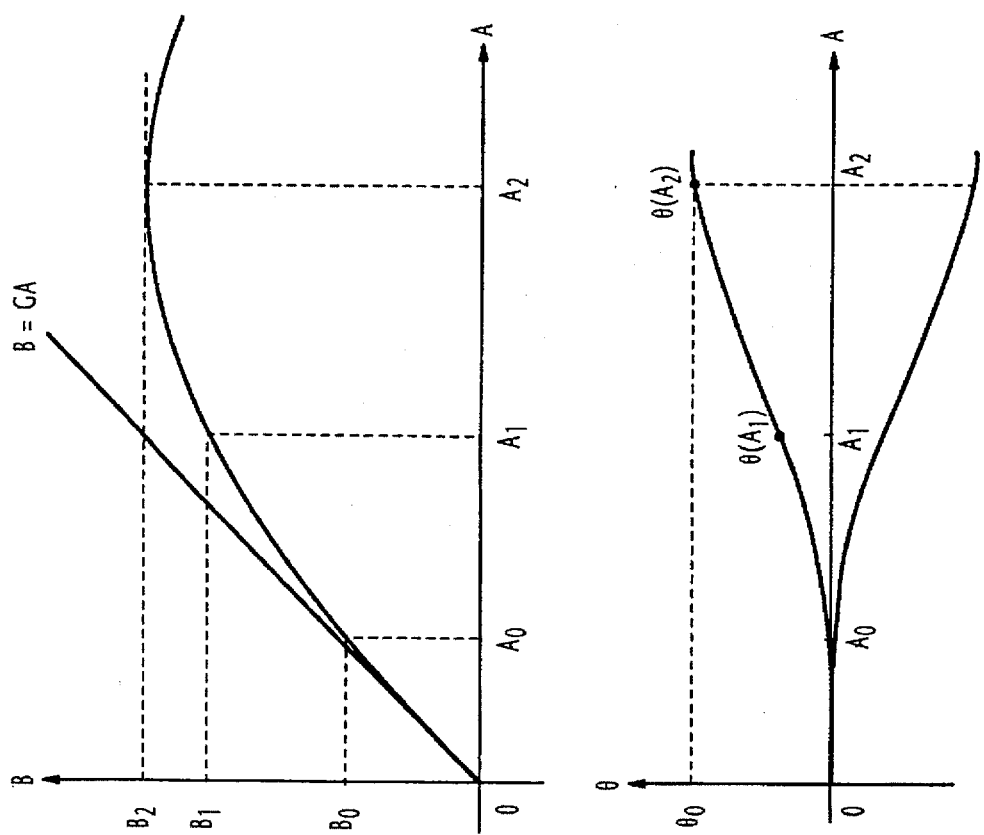
FIG. 2 is a block diagram of a complex multiplier used in the present invention.

As illustrated in detail in FIG. 2, the complex multiplier 22 includes multipliers 50-1 and 50-2 for multiplying the output signals x and y of filters 21-1 and 21-1 by the amplitude correction value α. The phase correction value β is translated to a cosine and a sine value by cosine and sine read-only memories 52 and 53, respectively. The output of cosine memory 52 is supplied to multipliers 51-1 and 51-3 to which the outputs of multipliers 50-1 and 50-2 are respectively supplied, whereas the output of sine memory 53 is supplied to multipliers 51-2 and 51-4 to which the outputs of multipliers 50-2 and 50-1 are respectively supplied. An adder 54-1 provides summing of the outputs of multipliers 51-1 and 51-2 to produce an amplitude and phase compensated signal I represented by α(x cos β+y sin β) and an adder 54-2 provide summing of the outputs of multipliers 51-3 and 51-4 to produce amplitude and phase compensated signal Q represented by α(x sin β+y cos β). In a complex notation, the outputs of adders 54-1 and 54-2 are alternatively represented by the relation (x+jy)α exp jβ.

Thus, the input orthogonal components I and Q are multiplied in amplitude by the factor α and rotated in phase angle by the factor β. Since the factors α and β are both retrieved from control memory 25 corresponding to the amplitude of the incoming signals I and Q, the output signal of the high-power amplifier 12 is linear as a function of the amplitude of its input signal.

Therefore, when the control memory 25 is operating in a read mode, the circuit including the envelope detector 23, selector 24, control memory 25 and latch 26 forms a feedforward control system for the complex multiplier 22 and the nonlinearity of the high-power amplifier is compensated. Because of the high speed operating capability, the feedforward control is advantageous for linear high-power amplification of a wideband (high speed) signal.

However, from the system's stability viewpoint the feedforward control is not satisfactory since the nonlinearity of the high-power amplifier varies with operating temperatures and the transmitter's operating parameters tend to vary with time. The present invention solves these shortcomings with the use of a negative feedback system comprising the QAM demodulator 45, A/D converters 46, error detector 31, update memory 30 and an integral feedback control loop formed by delay unit 29 connected between control memory 25 and update memory 30.

This negative feedback system operates when the control memory 25 is switched to a write mode under the control of timing controller 32. During this write mode, the amplitude error Δα and the phase error Δβ are supplied from error detector 31 to the update memory 30 and the amplitude and phase correction values α and β which were used to control the outputs of A/D converters 46 are supplied from delay unit 29 to the update memory 30. As will be described in detail later, update memory 30 produces new amplitude and phase correction values α' and β' from the error values Δα and Δβ and the values α and β stored in control memory 25 in locations corresponding to the amplitude of the input complex signal. The output of delay unit 28 is selected by timing controller 32 to specify a set of amplitude and phase correction values stored in control memory 25 and the specified correction values are rewritten with the new correction values from update memory 30.

The following is a quantitative analysis of the negative feedback system of the present invention.

Figure 3:
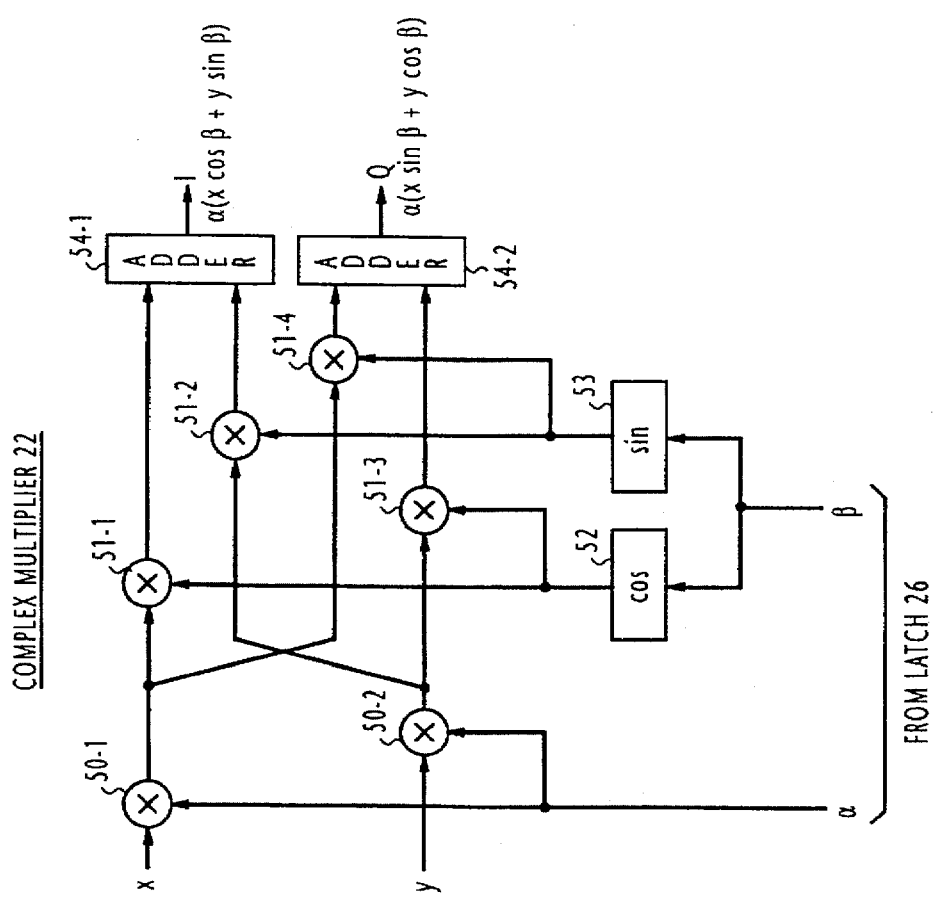
FIG. 3 is graphic representations of the amplitude and phase characteristics of a high-power amplifier.

Assuming that the high-power amplifier 12 has a nonlinear characteristic as illustrated in FIG. 3, where the ideal linear characteristic of the amplifier is represented as B=GA, where B is the amplitude of the output signal, G is the amplification factor and A is the amplitude of the input signal. Due to the nonlinearity of amplifier 12, the amplifier's input signal $V_i(t)$ and the output signal $V_o(t)$ are given in the form:

$$V_i(t)=A(t) \cos \{\omega t+\phi(t)\} \qquad (1)$$

$$V_o(t)=B(A(t)) \cos \{\omega t+\phi(t)+\theta(A(t))\} \qquad (2)$$

where, A(t) is the amplitude of the input signal and ωt is the angular frequency of the input signal, and the amplitude B(A(t)) and the phase θ(A(t)) are both nonlinear functions of amplitude A(t).

As shown in FIG. 3, when the input amplitude A is smaller than $A_0$, the amplitude characteristic is substantially linear and the phase characteristic is substantially flat, i.e., $\theta(A(t))=0$. When the input voltage is $A_1$, the output voltage is at $B_1$ short of the ideal point $B_2$. The output voltage reaches $B_2$ when the input is driven to as far as point $A_2$. When the input voltage is higher than $A_0$, the phase characteristic also enters the nonlinear zone. It is seen therefore that by controlling the amplitude and phase of the amplifier's input signal as a function of the amplitude A(t), the high power amplifier 12 can be said to operate as a linear amplifier.

By designating the amplitude and phase correction values $\alpha(A(t))$ and $\beta(A(t))$ as $\alpha(A)$ and $\beta(A)$, respectively, the input and output signals of high-power amplifier 12 are represented as follows:

$$V_i(t)=\alpha(A)\cdot A(t) \cos\{\omega t+\phi(t)+\beta(A)\} \quad (3)$$

$$V_o(t)=B(\alpha(A) A(t)) \cos\{\omega t+\phi(t)+\beta(A)+\theta(\alpha(A) A(t))\} \quad (4)$$

If $\alpha(A)$ and $\beta(A)$ are determined so that the following relations hold, $$\beta(\alpha(A) A(t))=G\cdot A(t) \quad (5)$$

$$\beta(A)=-\theta(\alpha(A) A(t)) \quad (6)$$

Equation (4) can be rewritten as:

$$V_o(t)=G\cdot V_i(t) \quad (7)$$

Specifically, $\alpha(A)$ and $\beta(A)$ are determined by the integral control provided by the loop formed by delay unit 29 as follows.

The feedback signals $V_f$ from A/D converters 46 can be denoted as $V_f=\gamma V_o(t=\tau)$, where $\gamma$ is the amplitude attenuation factor of the feedback path and $\tau$ is the delay time introduced by delay units 27, 28 and 29. Since $V_f$ is a complex signal, it can be given as:

$$V_f=\gamma B\{\alpha(A) A(t-\tau)\} \exp j\{\phi(t-\tau)+\beta(A)+\theta(A(t-\tau))\} \quad (8)$$

By representing the input signals $V_c$ of complex multiplier 22 as:

$$V_c(t)=A(t) \exp j\phi(t) \quad (9)$$

the error detector 31 solves the following calculation, $$\frac{V_f}{V_c(t-\tau)} = \frac{\gamma B(\alpha(A)A(t))}{A(t)} \exp j\{\beta(A)+\theta(\alpha(A)A(t))\} \quad (10)$$

and produces the amplitude and phase error values as follows:

$$\Delta\alpha(A) = \frac{A(t)}{\gamma B(\alpha(A)A(t))} \quad (11)$$

$$\Delta\beta(A) = \beta(A) + \theta(\alpha(A)A(t)) \quad (12)$$

By using the output signals of error detector 31, update memory 30 produces new correction values $\alpha(A)'$ and $\beta(A)'$ according to the following relations:

$$\alpha(A)'=\alpha(A) (\Delta\alpha(A))^m \quad (13)$$

$$\beta(A)'=\beta(A)-K\cdot\Delta\beta(A) \quad (14)$$

where, K is the phase control loop gain, which must be in the range between 0 and 1 for the stability of the loop, and m is the amplitude control loop gain, which must also be in the range between 0 and 1. From Equations (11), (12), (13) and (14), it can be shown that the system operates as a negative feedback system.

When the transmitter is in a steady state (i.e., the control memory 25 is in a read mode), $\alpha(A)'=\alpha(A), \beta(A)'=\beta(A)$, and $\Delta\alpha(A)=1$. From Equation (11), the following relation holds:

$$\beta(\alpha(A)A(t))=(1/\gamma)A(t) \quad (15)$$

By setting $\gamma$ equal to 1/G, Equation (15) is rewritten as:

$$\beta(\alpha(A)A(t))=G\cdot A(t) \quad (16)$$

Equation (16) indicates that the input-output amplitude characteristic of the high-power amplifier 12 is linearized. In addition, since the phase error $\Delta\beta(A)$ during the steady state is zero, the output of the high-power amplifier 12 is given as follows by rewriting Equation (4):

$$\begin{aligned}V_o(t) &= B(\alpha(A)A(t))\cos\{\omega t+\phi(t)+\beta(A)+\theta(\alpha(A)A(t))\} \\ &= G\cdot A(t)\cos\{\omega t+\phi(t)\} \\ &= G\cdot V_i(t)\end{aligned} \quad (17)$$

Equation (17) indicates that the input-output phase characteristic of amplifier 12 is linearized.

From the foregoing discussion it is seen that the feedforward control path of the transmitter performs high speed adaptive control on a wideband signal and the feedback control path periodically updates the adaptive control parameters according to the integral feedback control algorithm so that they adapt to changing circuit parameters that vary with time.

In addition, the linearization circuitry of the present invention is suitable for implementation with digital circuit technology advantageously for low power consumption and compact design.

What is claimed is:

1. A transmission apparatus comprising:

a complex multiplier for multiplying an input complex signal by control signals and producing a compensated complex signal;

an up-converter for converting the compensated complex signal to a high frequency signal;

a power amplifier for amplifying the high frequency signal for transmission;

an envelope detector for detecting an amplitude of said input complex signal;

a memory having a plurality of locations for storing a plurality of sets of amplitude and phase correction values, the memory supplying a set of amplitude and phase correction values from a location specified by the detected amplitude to the complex multiplier as said control signals during a read mode and rewriting a set of amplitude and phase correction values stored in a location specified by a delayed version of the detected amplitude with new amplitude and phase correction values during a write mode;

a down-converter for converting the amplified high frequency signal to a low frequency complex signal;

nonlinearity detector means for detecting nonlinearity of said power amplifier from a delayed version of the input complex signal and the low frequency complex signal and producing said new amplitude and phase correction values from the detected nonlinearity and delayed versions of the amplitude and phase correction values supplied to said complex multiplier; and means for periodically switching said memory from the read mode to the write mode.

2. A transmission apparatus as claimed in claim 1, wherein the nonlinearity detector means comprises:

an error detector for detecting amplitude and phase errors between the delayed version of the input complex signal and the low frequency complex signal; and update means for producing said new amplitude and phase correction values from the amplitude and phase errors and said delayed versions of the amplitude and phase correction values.

3. A transmission apparatus as claimed in claim 2, wherein the error detector includes means for producing said amplitude and phase errors by a ratio between said delayed version of the input complex signal and the low frequency complex signal to detect said amplitude and phase errors, and wherein said update means includes means for multiplying the delayed version of the amplitude correction value by the amplitude error and subtracting the phase error from the delayed version of the phase correction value.

4. A transmission apparatus as claimed in claim 2, wherein said update means comprises a memory for converting the delayed versions of the amplitude and phase correction values to said new amplitude and phase correction values according to the amplitude and phase errors.

5. A transmission apparatus as claimed in claim 1, further comprising a multiplexer for frequency division multiplexing a plurality of signals to produce a frequency-division multiplex signal, and converting the frequency-division multiplex signal to said input complex signal.

6. A transmission apparatus as claimed in claim 1, wherein said up-converter comprises a quadrature modulator and said down-converter comprises a quadrature demodulator.

7. A method for linearly operating a power amplifier, comprising the steps of:

a) detecting an amplitude of an input complex signal;

b) reading a set of amplitude and phase correction values from a location of a memory specified by the detected amplitude;

c) multiplying the input complex signal by the read amplitude and phase correction values to produce a compensated complex signal;

d) converting the compensated complex signal to a high frequency signal and supplying the high frequency signal to the power amplifier;

e) converting an output signal of the power amplifier to a low frequency complex signal;

f) detecting nonlinearity of said power amplifier from a delayed version of the input complex signal and the low frequency complex signal and producing a set of new amplitude and phase correction values from the detected nonlinearity and delayed versions of the amplitude and phase correction values read by the step (b); and g) rewriting a set of amplitude and phase correction values stored in a location of the memory specified by a delayed version of the amplitude detected by the step (a) with the new amplitude and phase correction values produced by the step (f).

8. A method as claimed in claim 7, wherein the step (f) comprises the steps of:

$f_1$) detecting amplitude and phase errors between the delayed version of the input complex signal and the low frequency complex signal; and $f_2$) producing said new amplitude and phase correction values from the amplitude and phase errors and delayed versions of the amplitude and phase correction values read by the step (b).

9. A method as claimed in claim 8, wherein the step ($f_1$) includes the step of producing said amplitude and phase errors by a ratio between said delayed version of the input complex signal and the low frequency complex signal to detect said amplitude and phase errors, and wherein the step ($f_2$) includes the step of multiplying the delayed version of the amplitude correction value by the amplitude error and subtracting the phase error from the delayed version of the phase correction value.

* * * * *